US012747498B2

(12) United States Patent
Susa et al.

(10) Patent No.: US 12,747,498 B2
(45) Date of Patent: Sep. 29, 2026

(54) METHOD OF FORMING DIELECTRIC MATERIAL LAYER USING PLASMA

(71) Applicant: ASM IP Holding B.V., Almere (NL)

(72) Inventors: Yoshio Susa, Tama (JP); Norihiko Ishinohachi, Tama (JP); Yoshiyuki Kikuchi, Tokyo (JP)

(73) Assignee: ASM IP Holding B.V., Almere (NL)

( * ) Notice: Subject to any disclaimer, the term of this patent is extended or adjusted under 35 U.S.C. 154(b) by 0 days.

(21) Appl. No.: 18/436,109

(22) Filed: Feb. 8, 2024

(65) Prior Publication Data

US 2024/0271280 A1 Aug. 15, 2024

Related U.S. Application Data

(60) Provisional application No. 63/445,100, filed on Feb. 13, 2023.

(51) Int. Cl.
*C23C 16/455* (2006.01)
*C23C 16/56* (2006.01)

(52) U.S. Cl.
CPC .. *C23C 16/45542* (2013.01); *C23C 16/45553* (2013.01); *C23C 16/56* (2013.01)

(58) Field of Classification Search
CPC ........ C23C 16/45542; C23C 16/45553; C23C 16/45536; C23C 16/56
See application file for complete search history.

(56) References Cited

U.S. PATENT DOCUMENTS

| | | | | |
|---|---|---|---|---|
| 6,756,085 B2 * | 6/2004 | Waldfried | C09D 183/02 427/508 |
| 8,551,892 B2 * | 10/2013 | Nakano | C23C 16/401 427/535 |
| 9,414,445 B2 | 8/2016 | Ahmad | |
| 2021/0257213 A1 * | 8/2021 | Kikuchi | H01L 21/02118 |

* cited by examiner

*Primary Examiner* — Michael P Wieczorek
(74) *Attorney, Agent, or Firm* — Snell & Wilmer L.L.P.

(57) ABSTRACT

A method of forming dielectric material layer on a surface of a substrate is provided. The method may comprise steps of: a deposition step at a deposition temperature comprising: providing a substrate within a first reaction chamber; providing a precursor to the first reaction chamber; providing a reactant to the first reaction chamber; and providing pulsed plasma power to the first reaction chamber; and a curing step comprising: providing a curing gas to the substrate; providing a first curing step at a first curing temperature; and providing a second curing step at a second curing temperature, wherein the second curing temperature is higher than the first curing temperature.

20 Claims, 4 Drawing Sheets

METHOD OF FORMING DIELECTRIC MATERIAL LAYER USING PLASMA

CROSS-REFERENCE TO RELATED APPLICATIONS

This application claims priority to U.S. Provisional Patent Application Ser. No. 63/445,100 filed Feb. 13, 2023 titled METHOD OF FORMING DIELECTRIC MATERIAL LAYER USING PLASMA, the disclosure of which is hereby incorporated by reference in its entirety.

FIELD OF INVENTION

The present disclosure generally relates to methods of forming layers suitable for use in the manufacture of electronic devices. More particularly, examples of the disclosure relate to methods of forming low dielectric constant material layers using plasma.

BACKGROUND OF THE DISCLOSURE

During the manufacture of devices, such as semiconductor devices, it is often desirable to fill features (e.g., trenches or gaps) on the surface of a substrate with insulating or dielectric material. In some cases, it may be desirable to fill the features with a low dielectric constant (low-k) material, such as carbon material (e.g., silicon oxygen carbide material) or other dielectric material, such as silicon oxide (SiOx), silicon nitride (SiNx), or the like. By way of examples, low-k material can be used as an intermetal dielectric layer on patterned metal features, a gap fill for fully aligned vias in back-end-of-line processes, an inner isolation layer for gate all around devices, insulating layers in resistive random-access memory (ReRAM) devices, and the like.

Some dielectric material deposition processes can use organic silanes or oxysilanes and an oxidant to form an initially flowable material. The material can be deposited using thermal or plasma. Such techniques often include a curing step to improve the film property such as k-value, Elastic modulus, and leakage current.

Voids inside the trenches may be formed during the curing step. This curing step may include mainly hydrogen plasma. Once the curing step is started, a carbon rich gas may start to evaporate from bottoms of the trenches, resulting in the voids in the trenches. These voids may lead to undesired film property, which may degrade its future electricity integration performance.

Accordingly, improved methods for forming a low-k material layer on a surface of a substrate, particularly for methods of filling gaps on a substrate surface with low-k such material, that provide desired material properties (e.g., less or few voids), are desired.

Any discussion, including discussion of problems and solutions, set forth in this section, has been included in this disclosure solely for the purpose of providing a context for the present disclosure, and should not be taken as an admission that any or all of the discussion was known at the time the invention was made or otherwise constitutes prior art.

SUMMARY OF THE DISCLOSURE

This summary is provided to introduce a selection of concepts in a simplified form. These concepts are described in further detail in the detailed description of example embodiments of the disclosure below. This summary is not intended to identify key features or essential features of the claimed subject matter, nor is it intended to be used to limit the scope of the claimed subject matter.

In accordance with exemplary embodiments of the disclosure, a method of forming dielectric material layer on a surface of a substrate is provided. The method may comprise steps of: a deposition step at a deposition temperature comprising: providing a substrate within a first reaction chamber; providing a precursor to the first reaction chamber; providing a reactant to the first reaction chamber; and providing pulsed plasma power to the first reaction chamber; and a curing step comprising: providing a curing gas to the substrate; providing a first curing step at a first curing temperature; and providing a second curing step at a second curing temperature, wherein the second curing temperature is higher than the first curing temperature.

In various embodiments, the deposition temperature may be higher than the first curing temperature.

In various embodiments, the deposition temperature may be lower than the second curing temperature.

In various embodiments, the deposition temperature may be 40° C. to 200° C.

In various embodiments, the first curing temperature may be 40° C. to 80° C.

In various embodiments, the second curing temperature may be 80° C. to 450° C.

In various embodiments, the first curing step may be conducted in a second reaction chamber and the second curing step may be conducted in a third reaction chamber.

In various embodiments, a power to produce the pulsed plasma power may be less than 2000 W.

In various embodiments, a pulse off time may be greater than 2 times the pulse on time, or the RF on duty cycle may be less than 50%.

In various embodiments, a pressure for the deposition step may be 1 to 1,200 Pa.

In various embodiments, the precursor may comprise a compound comprising an organosilicon compound.

In various embodiments, the precursor may comprise at least one of: octamethylcyclotetrasiloxane (OMCTS), tetramethylcyclotetrasiloxane (TMCTS), octamethoxydodecasiloxane (OMODDS), octamethoxycyclioiloxane, dimethyldimethoxysilane (DM-DMOS), diethoxymethlsilane (DEMS), dimethoxymethylsilane (DMOMS), phenoxydimethylsilane (PODMS), dimethyldioxosilylcyclohexane (DMDOSH), 1,3-dimethoxytetramethyldisiloxane (DMOTMDS), dimethoxydiphenylsilane (DMDPS), or dicyclopentyldimethoxysilane (DcPDMS).

In various embodiments, the reactant may comprise an oxidant.

In various embodiments, the oxidant may comprise at least one of O2, O3, N2O, N2O4, NxOy, CO, CO2, H2O, and H2O2, in any combination.

In various embodiments, the curing step may comprise using at least one of capacitively coupled plasma (CCP), ICP (Inductivity Coupled Plasma), and UV exposure.

In various embodiments, a frequency of the CCP may be 3 to 30 MHz with single RF power source.

In various embodiments, a power for the CCP may be higher than the pulsed plasma power of the deposition step.

In various embodiments, a pressure for the curing step may be 1 to 1,200 Pa.

In various embodiments, the curing gas may comprise Hydrogen and at least one of Helium or Argon to cure polymerized material.

In various embodiments, a volumetric ratio of the hydrogen to at least one of Helium or Argon may be 20% to 100%.

BRIEF DESCRIPTION OF THE DRAWING FIGURES

A more complete understanding of exemplary embodiments of the present disclosure can be derived by referring to the detailed description and claims when considered in connection with the following illustrative figures.

Figure 3A:
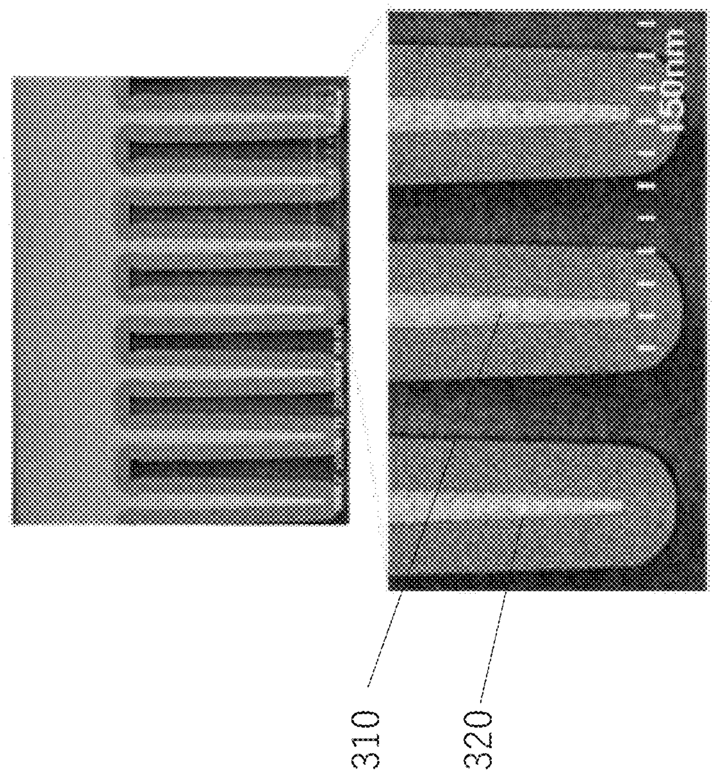

FIG. 3*a* illustrates scanning transmission electron microscopy images of structures in a prior art reference.

Figure 3B:
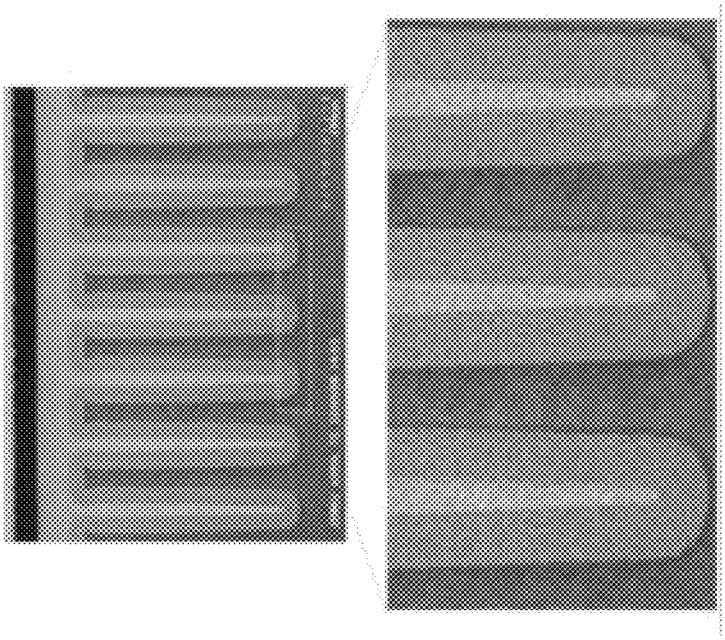

FIG. 3*b* illustrates scanning transmission electron microscopy images of structures in accordance with exemplary embodiments of the disclosure.

Figure 4:
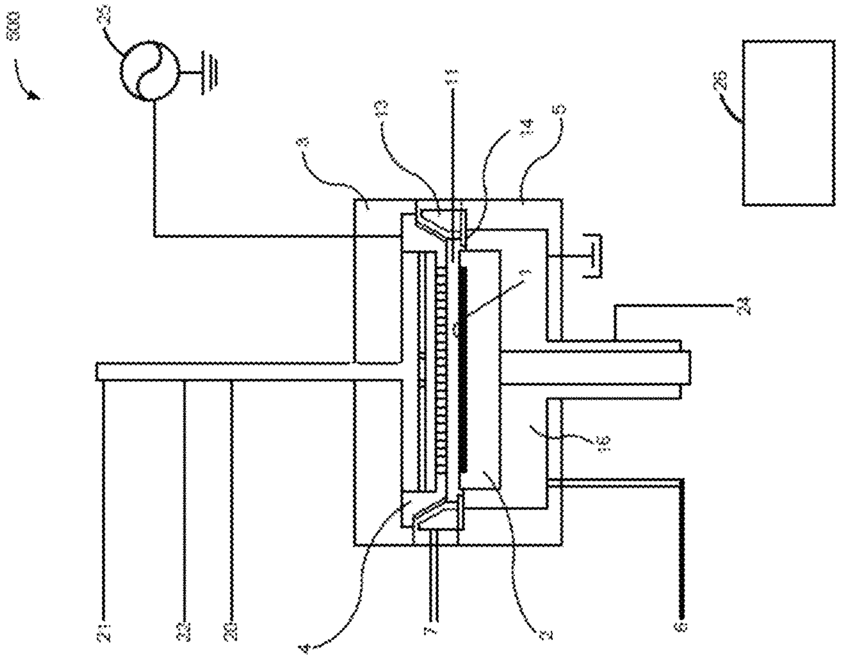

FIG. 4 illustrates a system in accordance with exemplary embodiments of the disclosure.

It will be appreciated that elements in the figures are illustrated for simplicity and clarity and have not necessarily been drawn to scale. For example, the dimensions of some of the elements in the figures may be exaggerated relative to other elements to help understanding of illustrated embodiments of the present disclosure.

DETAILED DESCRIPTION OF EXEMPLARY EMBODIMENTS

Although certain embodiments and examples are disclosed below, it will be understood by those in the art that the invention extends beyond the specifically disclosed embodiments and/or uses of the invention and obvious modifications and equivalents thereof. Thus, it is intended that the scope of the invention disclosed should not be limited by the particular disclosed embodiments described below As used herein, the term "substrate" may refer to any underlying material or materials, including any underlying material or materials that may be modified, or upon which, a device, a circuit, or a film may be formed. The "substrate" may be continuous or non-continuous; rigid or flexible; solid or porous; and combinations thereof. The substrate may be in any form, such as a powder, a plate, or a workpiece. Substrates in the form of a plate may include wafers in various shapes and sizes. Substrates may be made from semiconductor materials, including, for example, silicon, silicon germanium, silicon oxide, gallium arsenide, gallium nitride and silicon carbide.

As examples, a substrate in the form of a powder may have applications for pharmaceutical manufacturing. A porous substrate may comprise polymers. Examples of workpieces may include medical devices (for example, stents and syringes), jewelry, tooling devices, components for battery manufacturing (for example, anodes, cathodes, or separators) or components of photovoltaic cells, etc.

A continuous substrate may extend beyond the bounds of a process chamber where a deposition process occurs. In some processes, the continuous substrate may move through the process chamber such that the process continues until the end of the substrate is reached. A continuous substrate may be supplied from a continuous substrate feeding system to allow for manufacture and output of the continuous substrate in any appropriate form.

Non-limiting examples of a continuous substrate may include a sheet, a non-woven film, a roll, a foil, a web, a flexible material, a bundle of continuous filaments or fibers (for example, ceramic fibers or polymer fibers). Continuous substrates may also comprise carriers or sheets upon which non-continuous substrates are mounted.

The illustrations presented herein are not meant to be actual views of any particular material, structure, or device, but are merely idealized representations that are used to describe embodiments of the disclosure.

The particular implementations shown and described are illustrative of the invention and its best mode and are not intended to otherwise limit the scope of the aspects and implementations in any way. Indeed, for the sake of brevity, conventional manufacturing, connection, preparation, and other functional aspects of the system may not be described in detail. Furthermore, the connecting lines shown in the various figures are intended to represent exemplary functional relationships and/or physical couplings between the various elements. Many alternative or additional functional relationship or physical connections may be present in the practical system, and/or may be absent in some embodiments.

It is to be understood that the configurations and/or approaches described herein are exemplary in nature, and that these specific embodiments or examples are not to be considered in a limiting sense, because numerous variations are possible. The specific routines or methods described herein may represent one or more of any number of processing strategies. Thus, the various acts illustrated may be performed in the sequence illustrated, in other sequences, or omitted in some cases.

The subject matter of the present disclosure includes all novel and nonobvious combinations and subcombinations of the various processes, systems, and configurations, and other features, functions, acts, and/or properties disclosed herein, as well as any and all equivalents thereof.

In this disclosure, "gas" may include material that is a gas at normal temperature and pressure, a vaporized solid and/or a vaporized liquid, and may be constituted by a single gas or a mixture of gases, depending on the context. A gas introduced without passing through a gas supply unit, such as a shower plate, or the like, may be used for, e.g., sealing the reaction space, and may include a seal gas, such as a rare or other inert gas. The term inert gas, carrier gas, and dilution gas refer to a gas that does not take part in a chemical reaction to an appreciable extent and/or a gas that can excite a precursor when plasma power is applied.

As used herein, the term "film" and "thin film" may refer to any continuous or non-continuous structures and material deposited by the methods disclosed herein. For example, "film" and "thin film" could include 2D materials, nanorods, nanotubes, or nanoparticles or even partial or full molecular layers or partial or full atomic layers or clusters of atoms and/or molecules. "Film" and "thin film" may comprise material or a layer with pinholes, but still be at least partially continuous.

Figure 1:
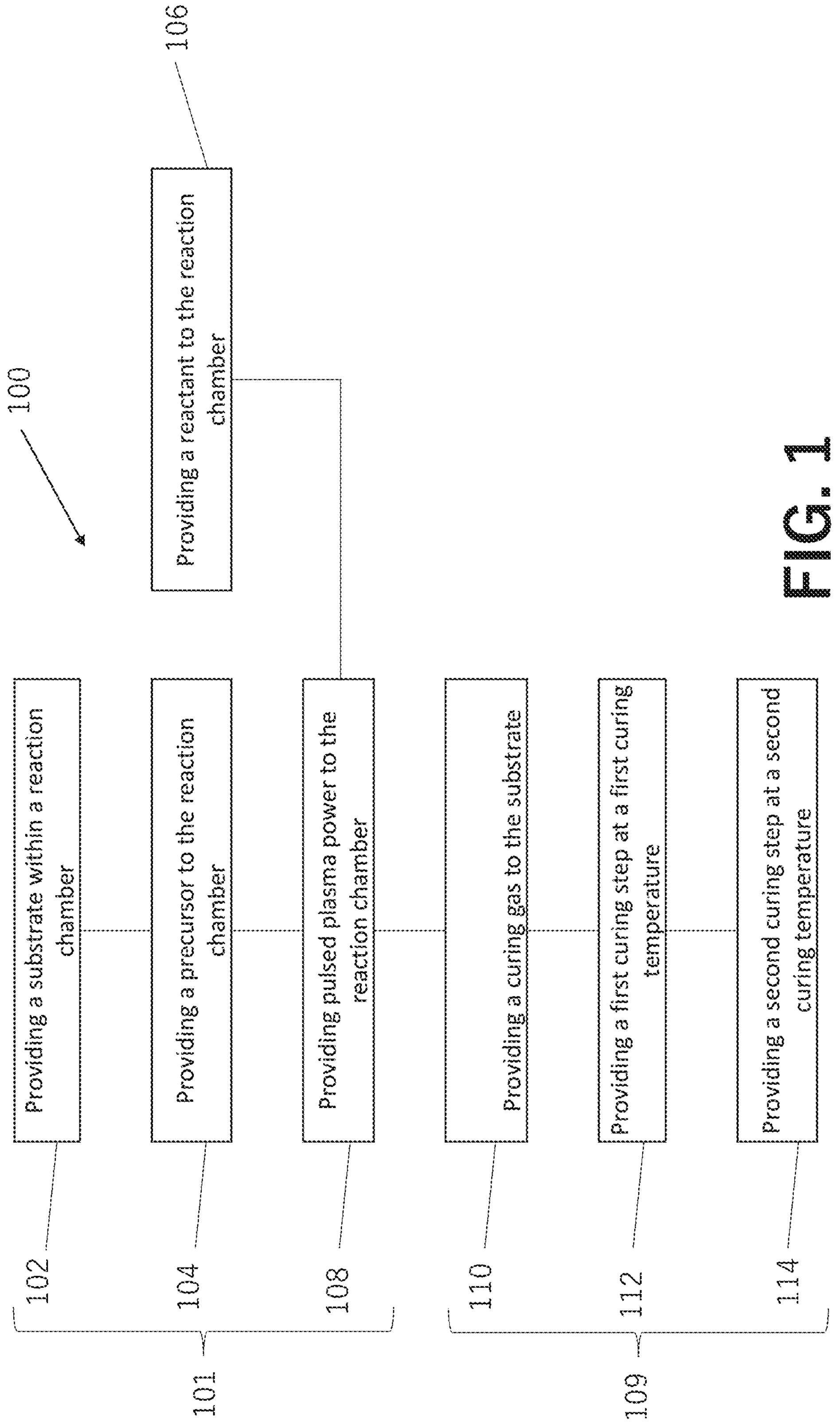
FIG. 1 illustrates a method in accordance with exemplary embodiments of the disclosure.

FIG. 1 illustrates a method 100 of forming a low-k material layer on a surface of a substrate in accordance with exemplary embodiments of the disclosure. Method 100 includes a deposition step 101 at a deposition temperature comprising: providing a substrate within a reaction chamber (step 102); providing a precursor to the reaction chamber (step 104); providing a reactant to the reaction chamber (step 106); and providing pulsed plasma power to the reaction chamber (108). Method 100 may further include a curing step 109 comprising: providing a curing gas to the substrate (step 110); providing a first curing step at a first curing temperature (step 112); and providing a second curing step at a second curing temperature (step 114).

During step 102, a substrate is provided into a reaction chamber of a gas-phase reactor. In accordance with examples of the disclosure, the reaction chamber can form part of a chemical vapor deposition reactor, such as a plasma-enhanced chemical vapor deposition (PECVD) reactor. Various steps of methods described herein can be performed within a single reaction chamber or can be performed in multiple reaction chambers, such as reaction chambers of a cluster tool.

During step 102, the substrate can be brought to a desired temperature and the reaction chamber can be brought to a desired pressure, such as a temperature and pressure suitable for subsequent steps. Byway of examples, a temperature (e.g., of a substrate or a substrate support) within a reaction chamber can be 40° C. to 200° C. A pressure within the reaction chamber can be from 1 to 1,200 Pa. In accordance with particular examples of the disclosure, the substrate includes one or more features, such as recesses.

During providing the precursor to the reaction chamber step 104, the precursor for forming the low-k material layer is introduced into the reaction chamber. Exemplary precursor can include an organosilicon compound, such as a cyclic organosilicon compound. The precursor can include a compound that includes a siloxane. Particular exemplary siloxanes include one or more of octamethylcyclotetrasiloxane (OMCTS), tetramethylcyclotetrasiloxane (TMCTS), octamethoxydodecasiloxane (OMODDS), octamethoxycyclioiloxane, dimethyldimethoxysilane (DM-DMOS), diethoxymethlsilane (DEMS), dimethoxymethylsilane (DMOMS), phenoxydimethylsilane (PODMS), dimethyldioxosilylcyclohexane (DMDOSH), 1,3-dimethoxytetramethyldisiloxane (DMOTMDS), dimethoxydiphenylsilane (DMDPS), and dicyclopentyldimethoxysilane (DcPDMS), octamethylcyclotetrasiloxane (OMCTS), tetramethylcyclotetrasiloxane (TMCTS), octamethoxydodecasiloxane (OMODDS), and octamethoxycycloicsiloxane.

During step 106, the reactant can be provided to the reaction chamber. The reactant can be flowed to the reaction chamber at the same time or overlapping in time with the step of providing one or more precursors to the reaction chamber. In this case, a chemical vapor deposition (CVD) reaction can occur. In some cases, the reactant and the precursor can be pulsed to the reaction chamber for a cyclical process, such as a cyclical CVD or an atomic layer deposition (ALD) process.

Exemplary reactant provided during step 106 includes an oxidant. The oxidant can include one or more of O2, O3, N2O, N2O4, NxOy, CO, CO2, H2O, and H2O2O2, O3, N2O, NOx, CO, CO2, H2O, and H2O2.

During the step of providing pulsed plasma power to polymerize the one or more precursors within the reaction chamber step 108, the precursor and the reactant provided to the reaction chamber are polymerized into the initially viscous material using excited species. The initially viscous carbon material can become solid material—e.g., through further reaction with excited species and/or during curing step 109. Step 108 can include, for example, PECVD, plasma enhanced atomic layer deposition (PEALD), or PE cyclical CVD.

The plasma can be generated using a direct plasma system, described in more detail below, and/or using a remote plasma system. A power used to generate the plasma during step 108 can be less than 2000 W or be between about 200 W and about 500 W. A frequency of the power can range from 1 from 3 to 30 MHz with single RF power sources.

During step 108, the plasma power may be pulsed. Pulsing the plasma power may facilitate controlling a sticking coefficient of excited precursors on a substrate surface. Generally, a small sticking coefficient may help surface migration and diffusion of polymers as they form.

Figure 2:
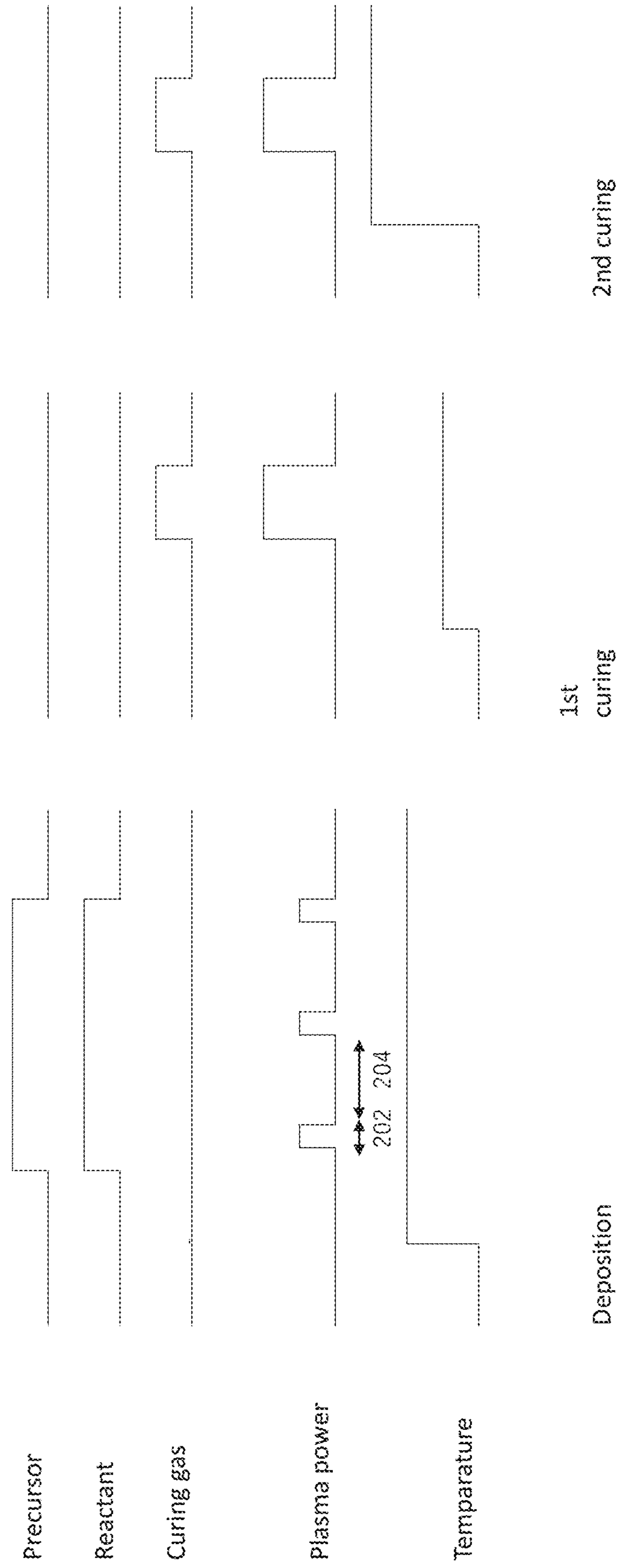
FIG. 2 illustrates a timing sequence in accordance with exemplary embodiments of the disclosure.

FIG. 2 illustrates a timing sequence in accordance with exemplary embodiments of the disclosure. During the period when the precursor and the reactant are being provided, the plasma power can be pulsed. A pulse can include a pulse on time 202 and a pulse off time 204, which can be repeated. Pulse on time 202 for the pulsed plasma power can be less than 50 μseconds, or about 10 μseconds to about 20 μseconds. Pulse off time 204 can be longer than pulse on time 202—e.g., greater than 2 or 5 times the pulse on time, or about 7 to about 10 times the pulse on time. Or, the RF on duty cycle can be less than 50%. The relatively short RF on time and relatively long RF off time is thought to enable control of the flowable deposition process by affecting the sticking coefficient of the polymerized precursor(s). If a long RF on time is applied, an amount of precursor excitation may be too much in gas phase, resulting in large particles, such as flakes forming in the gas phase. Also, shorter RF off times can result in particle and void formation due to lack of enough surface migration. By controlling chemical reactions and sticking coefficiency of precursor at the substrate surface using a pulsed plasma, both of good gap-filling capability and high film qualities of deposited low-k material layer may be achieved.

During step 110, the curing gas may be provided to a second reaction chamber. The curing gas may include Hydrogen and Helium or Argon to cure polymerized material. A volumetric ratio of the hydrogen to Helium or Argon may be 20% to 100%.

During step 112, the first curing step may be conducted within the second reaction chamber when the first curing temperature is reached. During step 114, the second curing step may be conducted at the second curing temperature. The curing gas may be provided to a third reaction chamber also and the second curing step may be conducted within the third reaction chamber. The temperature of the second curing step may be higher than the first curing temperature. The deposition temperature may be higher than the first curing temperature and the deposition temperature may be lower than the second curing temperature The deposition temperature may range between 40° C. to 200° C. The first curing temperature may range between 40° C. to 80° C. The second curing temperature may range between 80° C. to 450° C. The first curing step may be conducted in the same chamber or different chamber.

The curing step may comprise use at least one of capacitively coupled plasma (CCP), ICP (Inductivity Coupled Plasma), and UV exposure. A frequency of the CCP may be 3 to 30 MHz with single RF power source. A power for the CCP may be higher than the pulsed plasma power of the deposition step. A pressure for the curing step may be 1 to 1,200 Pa.

FIG. 3*a* illustrates scanning transmission electron microscopy images of structures in a prior art reference. Voids 310, 320 inside the trenches may be formed during the curing step. FIG. 3*b* illustrates scanning transmission electron microscopy images of structures in accordance with exemplary embodiments of the disclosure. No voids are observed after the curing step.

FIG. 4 illustrates a reactor system 500 in accordance with exemplary embodiments of the disclosure is illustrated. The reactor system 500 can be used to perform one or more steps or sub steps as described herein and/or to form one or more structures or portions thereof as described herein.

The reactor system 500 may include a pair of electrically conductive flat-plate electrodes 4, 2 in parallel and facing each other in an interior 11 (reaction zone) of a reaction chamber 3. A plasma can be excited within the reaction chamber 3 by applying, for example, HRF power (e.g., 13.56 MHz or 27 MHz) and/or low frequency power from a power source 25 to one electrode (e.g., electrode 4) and electrically grounding the other electrode (e.g., electrode 2). A temperature regulator can be provided in a lower stage 2 (the lower electrode), and a temperature of a substrate 1 placed thereon can be kept at a desired temperature. The electrode 4 may serve as a gas distribution device, such as a shower plate. Reactant gas, dilution gas, if any, precursor gas, and/or the like may be introduced into reaction chamber 3 using one or more of a gas line 20, a gas line 21, and a gas line 22, respectively, and through the shower plate 4. Although illustrated with three gas lines, the reactor system 500 can include any suitable number of gas lines.

In the reaction chamber 3, a circular duct 13 with an exhaust line 7 is provided, through which gas in the interior 11 of the reaction chamber 3 can be exhausted. Additionally, a transfer chamber 5, disposed below the reaction chamber 3, is provided with a seal gas line 24 to introduce seal gas into the interior 11 of the reaction chamber 3 via the interior 16 (transfer zone) of the transfer chamber 5, wherein a separation plate 14 for separating the reaction zone and the transfer zone is provided (a gate valve through which a wafer is transferred into or from the transfer chamber 5 is omitted from this figure). The transfer chamber is also provided with an exhaust line 6. In some embodiments, the deposition and treatment steps are performed in the same reaction space, so that two or more (e.g., all) of the steps can continuously be conducted without exposing the substrate to air or other oxygen-containing atmosphere.

In some embodiments, continuous flow of an inert or carrier gas to the reaction chamber 3 can be accomplished using a flow-pass system (FPS), wherein a carrier gas line is provided with a detour line having a precursor reservoir (bottle), and the main line and the detour line are switched, wherein when only a carrier gas is intended to be fed to a reaction chamber, the detour line is closed, whereas when both the carrier gas and a precursor gas are intended to be fed to the reaction chamber, the main line is closed and the carrier gas flows through the detour line and flows out from the bottle together with the precursor gas. In this way, the carrier gas can continuously flow into the reaction chamber, and can carry the precursor gas in pulses by switching between the main line and the detour line, without substantially fluctuating pressure of the reaction chamber.

A skilled artisan will appreciate that the apparatus includes one or more controller(s) programmed or otherwise configured to cause one or more method steps as described herein to be conducted. The controller(s) are communicated with the various power sources, heating systems, pumps, robotics and gas flow controllers, or valves of the reactor, as will be appreciated by the skilled artisan.

In some embodiments, a dual chamber reactor (two sections or compartments for processing wafers disposed close to each other) can be used, wherein a reactant gas and a noble gas can be supplied through a shared line, whereas a precursor gas is supplied through unshared lines.

The example embodiments of the disclosure described above do not limit the scope of the invention, since these embodiments are merely examples of the embodiments of the invention. Any equivalent embodiments are intended to be within the scope of this invention. Indeed, various modifications of the disclosure, in addition to those shown and described herein, such as alternative useful combinations of the elements described, may become apparent to those skilled in the art from the description. Such modifications and embodiments are also intended to fall within the scope of the appended claims.

What is claimed is:

1. A method of forming dielectric material layer on a surface of a substrate, the method comprising the steps of:
- a deposition step at a deposition temperature comprising:
  - providing a substrate within a first reaction chamber;
  - providing a precursor to the first reaction chamber;
  - providing a reactant to the first reaction chamber; and
  - providing pulsed plasma power to the first reaction chamber; and
- a curing step comprising:
  - providing a curing gas to the substrate;
  - providing a first curing step at a first curing temperature, wherein the first curing step comprises use of at least one of capacitively coupled plasma, inductivity coupled plasma, or UV exposure; and
  - providing a second curing step at a second curing temperature, wherein the second curing temperature is higher than the first curing temperature,
  - wherein the curing gas comprises a mixture of hydrogen and at least one of helium or argon,
  - wherein the curing gas is provided during the first curing step and the second curing step,
  - wherein the first curing step comprises use of at least one of the capacitively coupled plasma or the inductivity coupled plasma, and
  - wherein the second curing step comprises using at least one of the capacitively coupled plasma or inductivity coupled plasma.

2. The method of claim 1, wherein the deposition temperature is higher than the first curing temperature.

3. The method of claim 1, wherein the deposition temperature is lower than the second curing temperature.

4. The method of claim 1, wherein the deposition temperature is 40° C. to 200° C.

5. The method of claim 1, wherein the first curing temperature is 40° C. to 80° C.

6. The method of claim 1, wherein the second curing temperature is 80° C. to 450° C.

7. The method of claim 1, wherein the first curing step is conducted in a second reaction chamber and the second curing step is conducted in a third reaction chamber.

8. The method of claim 1, wherein the first curing step comprises use of the capacitively coupled plasma.

9. The method of claim 8, wherein the second curing step comprises using capacitively coupled plasma.

10. The method claim 9, wherein a power for the capacitively coupled plasma is higher than the pulsed plasma power of the deposition step.

11. The method of claim 1, wherein a pulse off time is greater than 2 times the pulse on time, or the RF on duty cycle is less than 50%.

12. The method of claim 1, wherein a pressure for the deposition step is 1 to 1,200 Pa.

13. The method of claim 1, wherein the precursor comprises a compound comprising an organosilicon compound.

14. The method of claim 13, wherein the precursor comprises at least one of: octamethylcyclotetrasiloxane (OMCTS), tetramethylcyclotetrasiloxane (TMCTS), octamethoxydodecasiloxane (OMODDS), octamethoxycyclioiloxane, dimethyldimethoxysilane (DM-DMOS), diethoxymethlsilane (DEMS), dimethoxymethylsilane (DMOMS), phenoxydimethylsilane (PODMS), dimethyldioxosilylcyclohexane (DMDOSH), 1,3-dimethoxytetramethyldisiloxane (DMOTMDS), dimethoxydiphenylsilane (DMDPS), or dicyclopentyldimethoxysilane (DcPDMS).

15. The method of claim 1, wherein the reactant comprises an oxidant.

16. The method of claim 15, wherein the oxidant comprises at least one of $O_2$, $O_3$, $N_2O$, $N_2O_4$, $N_xO_y$, CO, $CO_2$, $H_2O$, or $H_2O_2$, in any combination.

17. The method of claim 1, wherein the second curing step comprises using the capacitively coupled plasma, and wherein a frequency of a capacitively coupled plasma power is 3 to 30 MHz with single RF power source.

18. The method of claim 1, wherein a pressure for the curing step is 1 to 1,200 Pa.

19. The method of claim 1, wherein the curing gas comprises hydrogen and argon to cure polymerized material.

20. The method of claim 1, wherein a volumetric ratio of the hydrogen to at least one of helium or argon is 20% to 100%.

* * * * *